United States Patent [19]
Leung et al.

[11] Patent Number: 6,015,457
[45] Date of Patent: Jan. 18, 2000

[54] STABLE INORGANIC POLYMERS

[75] Inventors: Roger Y. Leung; Tadashi Nakano, both of San Jose, Calif.

[73] Assignee: AlliedSignal Inc., Morristown, N.J.

[21] Appl. No.: 09/039,289

[22] Filed: Mar. 12, 1998

Related U.S. Application Data

[60] Provisional application No. 60/044,478, Apr. 21, 1997.

[51] Int. Cl.[7] .................................................. C08G 77/04
[52] U.S. Cl. ......................... 106/287.16; 528/21; 528/31; 524/315; 524/361; 524/366; 524/367
[58] Field of Search ........................ 528/31, 21; 524/361, 524/315, 366, 377; 106/287.16

[56] References Cited

U.S. PATENT DOCUMENTS

| | | | |
|---|---|---|---|
| 2,637,718 | 5/1953 | Rust | 260/46.5 |
| 3,615,272 | 10/1971 | Collins et al. | 23/366 |
| 4,026,868 | 5/1977 | Merrill | 260/46.5 R |
| 4,399,266 | 8/1983 | Matsumura et al. | 528/10 |
| 4,609,751 | 9/1986 | Hajjar | 556/456 |
| 4,626,556 | 12/1986 | Nozue et al. | 522/99 |
| 4,670,299 | 6/1987 | Fukuyama et al. | 427/96 |
| 4,694,040 | 9/1987 | Hashimoto et al. | 524/765 |
| 4,723,978 | 2/1988 | Clodgo et al. | 65/31 |
| 4,749,631 | 6/1988 | Haluska et al. | 427/704 |
| 4,753,855 | 6/1988 | Haluska et al. | 428/702 |
| 4,756,977 | 7/1988 | Haluska et al. | 428/704 |
| 4,808,653 | 2/1989 | Haluska et al. | 524/398 |
| 4,822,697 | 4/1989 | Haluska et al. | 428/698 |
| 4,847,162 | 7/1989 | Haluska et al. | 428/457 |
| 4,849,296 | 7/1989 | Haluska et al. | 428/457 |
| 4,895,914 | 1/1990 | Saitoh et al. | 525/478 |
| 4,898,907 | 2/1990 | Haluska et al. | 524/490 |
| 4,911,992 | 3/1990 | Haluska et al. | 428/698 |
| 4,973,526 | 11/1990 | Haluska | 428/697 |
| 4,999,397 | 3/1991 | Weiss et al. | 524/755 |
| 5,008,320 | 4/1991 | Haluska et al. | 524/361 |
| 5,010,159 | 4/1991 | Bank et al. | 528/23 |
| 5,045,592 | 9/1991 | Weiss et al. | 524/755 |
| 5,059,448 | 10/1991 | Chandra et al. | 427/53.1 |
| 5,063,267 | 11/1991 | Hanneman et al. | 524/284 |
| 5,085,893 | 2/1992 | Weiss et al. | 427/387 |
| 5,091,162 | 2/1992 | Frye et al. | 423/325 |
| 5,106,604 | 4/1992 | Agaskar | 423/325 |
| 5,116,637 | 5/1992 | Baney et al. | 427/340 |
| 5,118,530 | 6/1992 | Hanneman et al. | 427/226 |
| 5,145,723 | 9/1992 | Ballance et al. | 427/397.7 |
| 5,165,955 | 11/1992 | Gentle | 427/575 |
| 5,183,684 | 2/1993 | Carpenter | 427/574 |

(List continued on next page.)

FOREIGN PATENT DOCUMENTS

| | | |
|---|---|---|
| 2100278 | 1/1994 | Canada . |
| 0 270 231 | 6/1988 | European Pat. Off. . |
| 0 270 263 | 6/1988 | European Pat. Off. . |
| 0 270 299 | 6/1988 | European Pat. Off. . |
| 0 270 369 | 6/1988 | European Pat. Off. . |
| 0 323 103 | 7/1989 | European Pat. Off. . |
| 0 323 186 | 7/1989 | European Pat. Off. . |
| 0 410 564 | 1/1991 | European Pat. Off. . |
| 0 419 076 | 3/1991 | European Pat. Off. . |
| 0 427 395 | 5/1991 | European Pat. Off. . |
| 0 443 760 A2 | 8/1991 | European Pat. Off. ........ C08G 77/12 |
| 0 461 782 | 12/1991 | European Pat. Off. . |
| 0 462 715 | 12/1991 | European Pat. Off. . |
| 0 466 205 | 1/1992 | European Pat. Off. . |
| 0 493 879 | 7/1992 | European Pat. Off. . |
| 0 510 872 | 10/1992 | European Pat. Off. . |
| 0 512 717 | 11/1992 | European Pat. Off. . |
| 0 516 144 | 12/1992 | European Pat. Off. . |
| 0 516 308 | 12/1992 | European Pat. Off. . |
| 0 560 485 | 9/1993 | European Pat. Off. . |
| 0 596 678 | 5/1994 | European Pat. Off. . |
| 0 599 209 | 6/1994 | European Pat. Off. . |
| 0 604 779 | 7/1994 | European Pat. Off. . |
| 0 606 580 | 7/1994 | European Pat. Off. . |
| 0 606 588 | 7/1994 | European Pat. Off. . |
| 0 615 000 | 9/1994 | European Pat. Off. . |
| 0 616 001 | 9/1994 | European Pat. Off. . |
| 0 686 680 | 12/1995 | European Pat. Off. . |
| 0 725 103 | 8/1996 | European Pat. Off. . |
| 196 08 904 | 9/1996 | Germany . |
| 52-31854 | 8/1977 | Japan . |
| 53-88099 | 8/1978 | Japan . |
| 55-111148 | 8/1980 | Japan . |
| 56-139533 | 10/1981 | Japan . |
| 57-112047 | 7/1982 | Japan . |
| 58-003249 | 1/1983 | Japan . |
| 58-066335 | 4/1983 | Japan . |
| 59-109565 | 6/1984 | Japan . |
| 59-189126 | 10/1984 | Japan . |
| 59-190211 | 10/1984 | Japan . |
| 60-42426 | 3/1985 | Japan . |
| 60-86017 | 5/1985 | Japan . |
| 60-124943 | 7/1985 | Japan . |
| 61-029153 | 2/1986 | Japan . |
| 61-127732 | 6/1986 | Japan . |
| 61-292342 | 12/1986 | Japan . |
| 2-277255 | 11/1990 | Japan . |
| 3-6845 | 1/1991 | Japan . |
| 3-227321 | 10/1991 | Japan . |
| 4-252228 | 9/1992 | Japan . |
| 4-252229 | 9/1992 | Japan . |
| WO 97/10282 | 3/1997 | WIPO . |

OTHER PUBLICATIONS

Hacker, N., "Organic and Inorganic Spin–On Polymers for Low–Dielectric–Constant Applications," *MRS Bulletin*, vol. 22, No. 10, Oct. 1997, pp. 33–38.

*Primary Examiner*—Melvyn I. Marquis
*Assistant Examiner*—Mark W. Milstead
*Attorney, Agent, or Firm*—Skjerven, Morrill, MacPherson, Franklin & Friel LLP; Roberta P. Saxon

[57] ABSTRACT

Processes for producing poly (hydrido siloxane) copolymers and processes for producing solutions of such copolymers for coating semiconductor substrates are provided. The copolymers have the general formula: $(HSiO_{1.5})_a(HSiO(OR))_b(SiO_2)_c$, wherein R is a mixture of H and an alkyl group having between 1 and 4 carbon atoms; $a+b+c=1$; $0.5<a<0.99$; $0.01<b<0.5$; and $0<c<0.5$. Processes for producing the copolymers use alkoxysilanes as starting materials. Processes for producing coating solutions include removal of water and alcohol. Films of such coating solutions are useful as planarizing dielectric layers.

8 Claims, 1 Drawing Sheet

U.S. PATENT DOCUMENTS

| | | | |
|---|---|---|---|
| 5,210,168 | 5/1993 | Bergstrom et al. | 528/12 |
| 5,238,787 | 8/1993 | Haluska et al. | 430/325 |
| 5,258,334 | 11/1993 | Lantz, II | 437/238 |
| 5,262,201 | 11/1993 | Chandra et al. | 427/376.2 |
| 5,279,661 | 1/1994 | Gentle | 106/287.1 |
| 5,283,545 | 2/1994 | Pernisz | 338/308 |
| 5,290,354 | 3/1994 | Haluska | 106/479 |
| 5,293,335 | 3/1994 | Pernisz et al. | 365/148 |
| 5,310,583 | 5/1994 | Eckstein et al. | 427/575 |
| 5,312,684 | 5/1994 | Michael et al. | 428/336 |
| 5,320,868 | 6/1994 | Ballance et al. | 427/228 |
| 5,336,532 | 8/1994 | Haluska et al. | 427/515 |
| 5,348,839 | 9/1994 | Haluska et al. | 430/270 |
| 5,370,903 | 12/1994 | Mine et al. | 427/126.2 |
| 5,370,904 | 12/1994 | Mine et al. | 427/126.2 |
| 5,372,842 | 12/1994 | Mine et al. | 427/126.2 |
| 5,380,567 | 1/1995 | Haluska | 427/578 |
| 5,416,190 | 5/1995 | Mine et al. | 528/492 |
| 5,436,029 | 7/1995 | Ballance et al. | 427/126.2 |
| 5,441,765 | 8/1995 | Ballance et al. | 427/228 |
| 5,445,894 | 8/1995 | Haluska et al. | 428/557 |
| 5,446,088 | 8/1995 | Haluska | 524/588 |
| 5,486,564 | 1/1996 | Mine et al. | 524/588 |
| 5,496,402 | 3/1996 | Sakamoto et al. | 106/287.16 |
| 5,523,163 | 6/1996 | Ballance et al. | 428/446 |
| 5,540,948 | 7/1996 | Haluska | 427/96 |
| 5,547,703 | 8/1996 | Camilletti et al. | 427/126.3 |
| 5,609,925 | 3/1997 | Camilletti et al. | 427/503 |
| 5,618,878 | 4/1997 | Syktich et al. | 524/588 |
| 5,635,240 | 6/1997 | Haluska et al. | 427/180 |
| 5,656,555 | 8/1997 | Cho | 438/760 |
| 5,665,849 | 9/1997 | Cho | 528/31 |
| 5,707,681 | 1/1998 | Bremmer et al. | 427/58 |
| 5,707,683 | 1/1998 | Currie et al. | 427/126.2 |
| 5,762,697 | 6/1998 | Sakamoto et al. | 106/287.16 |
| 5,795,378 | 8/1998 | Sakamoto et al. | 106/287.16 |
| 5,853,808 | 12/1998 | Arkles et al. | 427/377 |
| 5,858,544 | 1/1999 | Holl et al. | 428/447 |

STABLE INORGANIC POLYMERS

This application claims the benefit of U.S. Provisional Application No. 60/044,478 filed Apr. 21, 1997, entitled "Novel Low K Inorganic Polymer for Non-Etchback Applications" and naming Roger Y. Leung, Tadashi Nakano, Suzanne Case, and Brian Sung as inventors, which is incorporated herein by reference.

BACKGROUND

1. Scope of the Invention

The present invention relates generally to processes for making stable poly(hydrido siloxane) inorganic polymers and methods of manufacturing films thereof, and more specifically to stable poly(hydrido siloxane) polymers for use as dielectric films and methods of manufacture thereof.

2. Related Art

Advances in the semiconductor industry are characterized by the introduction of new generations of integrated circuits (IC's) having higher performance and greater functionality than that of the previous generation. These advances are often the result of reducing the size of the IC devices. However, as device geometries become smaller, the dielectric constant of an insulating material used between conductive paths, for example, silicon oxide ($SiO_2$), becomes an increasingly important factor in device performance. Reducing this value below the approximately 3.9 of a $SiO_2$ film advantageously lowers power consumption, reduces crosstalk, and shortens signal delay for closely spaced conductors.

Often, fabricating IC devices requires creating multilevel interconnect structures. One challenge in implementing multilevel interconnect structures for IC devices and particularly for submicron IC devices is to planarize multilevel metal structures. Spin-on glass (SOG) materials have been widely used to create dielectric films to planarize such structures.

The commonly used SOG materials are generally characterized either as SOG's having organic substituents, termed organic SOG's, or SOG's without such substituents termed inorganic SOG's. Films made from organic SOG's provide good planarization. However, when such materials remain over locations where vias, or contact openings, are to be made, a common problem known as "poisoned-vias" is often encountered. To avoid the poisoned-via problem, an additional process step, known as an etchback step is generally employed to remove SOG material from via locations.

Dielectric films made from previously known inorganic SOG's avoid the poisoned-via problem without an etchback step. However, such films have other problems. First, generally the previously known inorganic SOG films exhibit higher dielectric constants than organic SOG films. Additionally, films made of these inorganic SOG's having sufficient thickness for use as interlevel dielectric layers are susceptible to cracking. Thus it would be desirable to have an inorganic SOG that forms crack resistant films having a low dielectric constant.

Films based on the cage structure hydrogen silsesquioxane (HSQ) resin, for example, as described in U.S. Pat. No. 4,756,977, "MULTILAYER CERAMICS FROM HYDROGEN SILSESQUIOXANE," are one attempt at achieving the aforementioned goals. Films produced from such HSQ resins are known to have dielectric constants as low as 3.0 and can be made as thick as 1 μm with little or no cracking. However, HSQ resins having a cage structure form films that include strained Si-O bonds which are reactive toward alcohols, acetone, and esters. The cage HSQ resin is known to gel quickly in acetone or ethyl acetate solvents. Cage HSQ resins also have a substantially ordered structure which requires melting and reflow to achieve planarization. In addition, films produced from cage HSQ resins are reported to degrade upon exposure to an oxygen plasma. The unstable nature of films formed using cage structure HSQ resins is overcome by alternate HSQ materials, for example branched polymers. Branched HSQ polymers with silanol end groups are more stable in solutions of alcohols, acetone and ethyl acetate than cage HSQ resins. However, branched HSQ polymers in solution, increase in molecular weight over time due to polymer cross-linking. A stable HSQ polymer material having a branched, or ladder, structure is described in Japanese Kokai Patent No. Sho 60-12493. However, the polymer material in Sho 60-12493 is terminated with trialkylsiloxy groups. Hence films formed therefrom are susceptible to degradation by an oxygen plasma.

Thus it would be desirable to manufacture and use an inorganic SOG material that is resistant to degradation by commonly used oxygen plasmas. It would be desirable for the SOG material to allow for the formation of films that are amorphous in character. It would also be desirable for such SOG material to be stable when stored for longer than 3 months. In addition, it would be desirable for films formed from the SOG material to exhibit good gap filling characteristics and to have good adhesion to a variety of semiconductor materials. It would further be desirable for films formed from the inorganic SOG to have good thermal stability as evidenced by low water absorption and to be formulated with common solvents.

SUMMARY

In accordance with this invention, processes for producing poly(hydrido siloxane) copolymers having a general formula:

$$(HSiO_{1.5})_a(HSiO(OR))_b(SiO_2)_c, \qquad \text{Formula 1}$$

are provided, wherein R is a mixture of H and an alkyl, group having between 1 and 4 carbon atoms; a+b+c=1; 0.5<a<0.99; 0.01<b<0.5; and 0<c<0.5. As used hereinafter, the term copolymer includes terpolymers. The processes of the present invention are carried out by combining an alkoxysilane with an aprotic solvent and an acid/water mixture, and causing them to react. In some embodiments, the alkoxysilane is first combined with the aprotic solvent and cooled before adding the acid/water mixture. Sometimes, after adding the acid/water mixture the process provides for heating the reaction mixture.

In some embodiments of the present invention, a solution for coating a semiconductor substrate is provided. In some embodiments, such solutions encompass poly(hydrido siloxane) copolymers of general Formula 1. In some embodiments, solutions of poly(hydrido siloxane) copolymers encompass one or more aprotic solvents, for example, dialkylketals, dialkylacetals, ethers, ketones, or esters.

In accordance with the present invention, methods for making the above poly(hydrido siloxane) solutions for coating semiconductor substrates are provided. Such methods encompass adding aprotic solvents or combinations of such solvents to a reaction vessel charged with poly (hydrido siloxane) copolymer to form a solution; removing water and alcohol from the solution; optionally providing an endcap for the polymer; and adjusting polymer concentration with additional solvent, where appropriate.

A semiconductor device in accordance with this invention is also provided having dielectric layers disposed overlying a surface. Such dielectric layers are formed from poly (hydrido siloxane) coating solutions. In some embodiments, dielectric layers formed have good resistance to degradation by exposure to an oxygen plasma. In some embodiments, coating solutions used to form dielectric layers are stable when stored for 6 months or longer.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
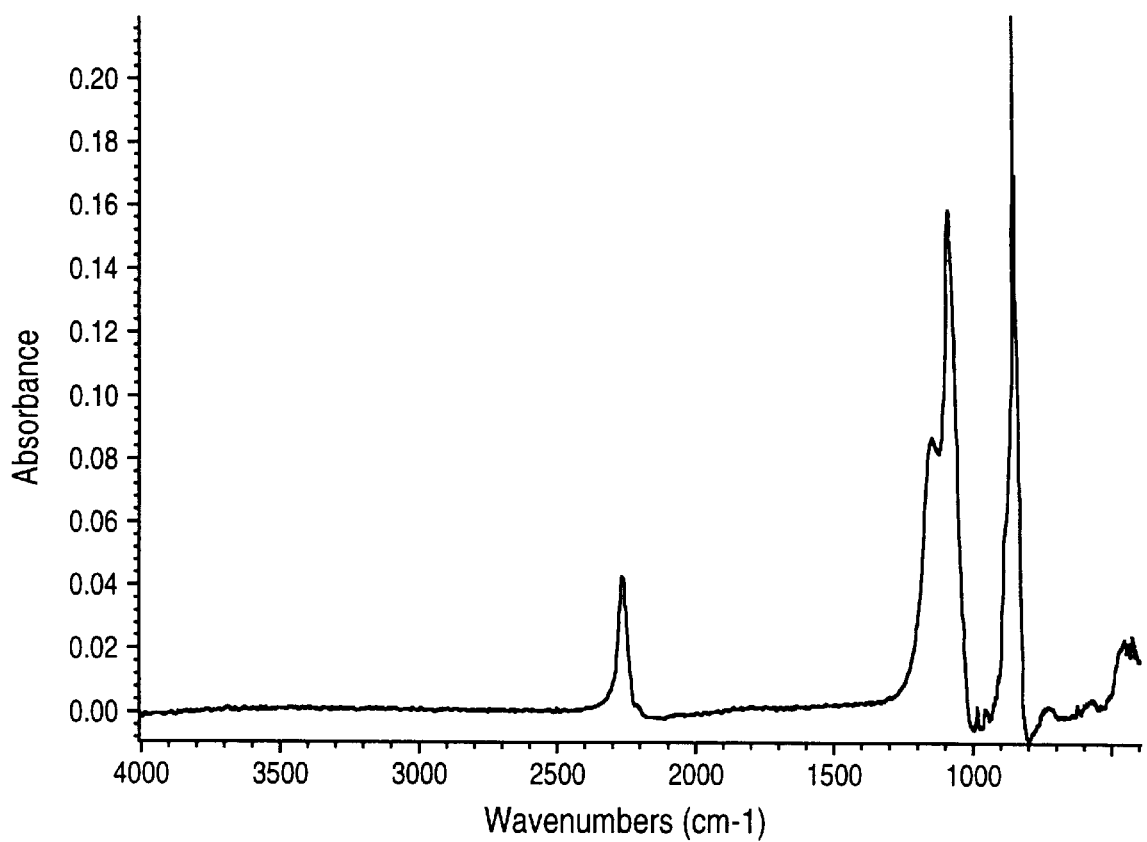
FIG. 1 is a Fourier Transform Infrared Spectroscopy (FTIR) spectrum of a film formed from a poly (hydrido siloxane) coating solution prepared in accordance with embodiments of the present invention.

In accordance with this invention, processes for producing branched poly(hydrido siloxane) copolymers of general Formula 1:

$(HSiO_{1.5})_a(HSiO(OR))_b(SiO_2)_c$,           Formula 1 wherein R is a mixture of H and an alkyl group having between 1 and 4 carbon atoms; $a+b+c=1$; $0.5<a<0.99$; $0.01<b<0.5$; and $0<c<0.5$ are provided. Trialkoxysilane or a mixture of trialkoxysilane and tetraalkoxysilane are used as starting materials. To avoid and/or reduce contamination of the copolymer by trace amounts of metals normally encountered with glass reaction vessels, plastic reaction vessels are advantageously used where appropriate. However, where glass reaction vessels are required, the glass reaction vessels are pre-treated to reduce trace metal contamination. Such pretreatments are known in the art. In some embodiments, triethoxysilane (HTEOS) is the starting material. A reaction vessel is charged with HTEOS and an aprotic solvent, for example, acetone, to provide a reaction mixture. It will be understood that other aprotic solvents such as ethyl acetate, n-propyl acetate, or tetrahydrofuran are alternatively employed. An acid/water mixture, for example, nitric acid and water, is added dropwise to the reaction mixture while stirring. Other acids, such as acetic acid, formic acid, or phosphoric acid are alternatively used in the acid mixture. Optionally, in some embodiments, the reaction mixture is maintained at a temperature below 20° C. during the acid/water mixture addition. Once addition of the acid/water mixture is complete, the resulting solution is heated to reflux for between approximately 6 and 9 hours to produce a solution of poly (hydrido siloxane) copolymer in accordance with Formula 1.

In some embodiments, synthesis of poly (hydrido siloxane) copolymer is conducted at room temperature. A plastic vessel is charged with HTEOS, water, acid, and an aprotic solvent to provide a reaction mixture. The reaction mixture is stirred at room temperature (21° C.) for approximately 3 days to 14 days to provide a solution of poly (hydrido siloxane) copolymer in accordance with Formula 1.

In some embodiments, a mixture of triethoxysilane (HTEOS) and tetraethoxysilane (TEOS) is dissolved in an aprotic solvent such as diethylene glycol dimethyl ether. For example, a HTEOS:TEOS mixture having a molar ratio between 1 and 20 has been found to be advantageous. An acid is added and the reaction carried out at room temperature for 24 hours to produce a solution of poly (hydrido siloxane) copolymer in accordance with Formula 1.

It will be understood that in some embodiments of the processes for producing poly (hydrido siloxane) copolymers of general Formula 1, other trialkoxysilanes, such as trimethoxysilane or tripropoxysilane, and other tetraalkoxysilanes, such as tetramethoxysilane, are advantageously used as starting materials.

It has been found that the molecular weight of the poly(hydrido siloxane) copolymer in solution and the ratio of $HSiO_{1.5}$ to $HSiO(OR)$ content, i.e. the ratio of a to b in Formula 1, is proportional to the amount of time the reaction mixture is refluxed or allowed to react at room temperature.

In accordance with some embodiments of the present invention, coating solutions of the poly (hydrido siloxane) copolymer of Formula 1, with copolymer contents from about 5% to 50% by weight, and preferably from about 8% to 20% by weight, are prepared. In some embodiments, the poly (hydrido siloxane) copolymer solution is combined with a solvent or combination of solvents. In some embodiments, it has been advantageously found that 2,2-dimethoxypropane (DMP) and a mixture of DMP and dibutylether (DBE) are appropriate solvents. Other advantageous solvents include dialkylketals besides DMP, such as 2,2-diethoxypropane or 2-ethoxy, 2-propoxypropane; dialkylacetals, such as acetaldehyde diethylacetal; esters, such as ethyl acetate, n-propyl acetate, or butyl acetate; ethers, such as ethylene glycol dimethyl ether; and ketones, such as acetone or methyl isobutyl ketone.

In embodiments of the present invention, a process for producing the above-mentioned coating solutions is provided. Since alcohol is formed as a byproduct of the reactions producing the poly (hydrido siloxane) copolymer, and water is present, in excess amounts, as a reagent in the copolymer producing reaction, the first step is to remove water and alcohol from copolymer solutions. Removing water and alcohol provides coating solutions with improved stability. As written in Formula 1, poly (hyrdrido siloxane) copolymers contain Si—H bonds. Water and alcohol both react with the Si—H bonds in the copolymers to form silanol (Si—OH) and alkoxy (Si—OR) bonds, respectively. Silanol and alkoxy bonds react to form Si—O—Si linkages in the copolymers, commonly referred to as cross-linking, thus increasing the molecular weight of the copolymer. Removal of water and alcohol provides for a more stable solution by preventing cross-linking.

In one advantageous process for removing water and alcohol, a dialkylketal, or a combination of dialkylketal and aprotic solvent, for example, a combination of DMP and DBE, is added to a reaction vessel charged with poly (hydrido siloxane) copolymer solution. The solution is heated to a first temperature for a first period to promote a chemical reaction between the water and dialkylketal. This reaction consumes water. Next the solution is heated to a second temperature, higher than the first temperature, for a second period, to distill off alcohol. For example, where DMP is employed, the following reaction to remove water results in the formation of additional alcohol:

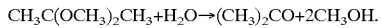

$CH_3C(OCH_3)_2CH_3+H_2O \rightarrow (CH_3)_2CO+2CH_3OH$.

The aforementioned distillation also serves to remove the methanol formed by reaction with DMP.

Where an excess of dialkylketal is charged to the above reaction vessel, the above distillation also serves to provide energy to effect a reaction between the dialkylketal and at least some silanol bonds of the poly (hydrido siloxane) copolymer. This reaction, a process termed endcapping, converts silanol bonds to less reactive alkoxy bonds. This endcapping of the copolymer inhibits cross-linking and thus promotes stability.

In another process for removing water and alcohol, evaporation by distillation under normal or reduced pressure is employed. In this process, a solution of poly (hydrido siloxane) copolymer is alternately concentrated to higher copolymer content by removal of water and alcohol and diluted to lower concentration with additional solvent. It has been found that mixtures of water and alcohol are advantageously removed using rotary evaporation techniques both at atmospheric and reduced pressures. For example, where alkylacetates are advantageously used as solvents, final copolymer solutions having water content of less than 0.5% by weight and alcohol content of less than 1% by weight are readily prepared using the above described methods.

After removal of water and alcohol, in some embodiments of the present invention, the resulting poly (hydrido siloxane) copolymer solution is diluted to a predetermined copolymer concentration, for example to between 8 and 20% copolymer by weight, with additional solvent. The solvents in the poly (hydrido siloxane) coating solution are compatible with materials of which typical semiconductor processing systems are constructed. The solvents do not swell, dissolve, or react with PVC coater materials, even after prolonged exposure.

Prior to use, copolymer solutions in accordance with the present invention are filtered. A variety of known filtration devices and/or methods known in the art are advantageously employed.

The processes described above advantageously provide for embodiments of the present invention that are essentially free of Si—OH bonds. FIG. 1 shows a Fourier Transform Infrared Spectroscopy (FTIR) spectrum of a film formed from a poly (hydrido siloxane) coating solution prepared in accordance with embodiments of the present invention. If Si—OH bonds were present in the film, absorption peaks between 3200 and 3700 $cm^{-1}$ would appear in the FTIR spectrum. The absence of any peak in the FTIR spectrum in FIG. 1 between 3200 and 3700 $cm^{-1}$ demonstrates the film is essentially free of Si—OH bonds.

Solutions of poly (hydrido siloxane) compositions in accordance with embodiments of the present invention are typically used to form a spin-on glass coating on integrated circuits formed on a semiconductor substrate or wafer. The solutions are typically applied using a spin-coating process, although other appropriate coating processes, for example spraying, can also be used. As one of ordinary skill in the art knows, semiconductor substrates are currently available in a variety of sizes ranging from as small as three or four inches in diameter to as large as twelve inches in diameter. Therefore, it will be understood that the process parameters presented hereinafter are for a 6 inch wafer and are for illustrative purposes only. Thus, modifications to the volume of material, solution concentration, rotational speeds or the various times described below are appropriate for specific applications. It will be understood that all such modification are within the scope and spirit of the present invention.

In the spin coating process, the poly (hydrido siloxane) coating solution, prepared in the manner previously described, is dispensed onto a wafer at or near its center. In some embodiments, the wafer will remain stationary during the dispense cycle, while in some embodiments the wafer will turn, or spin. Where the solution is dispensed while the wafer spins, the speed employed is typically less than about 100 revolutions per minute (rpm). The dispense cycle is typically followed by a period of relatively slow rotation before the speed of rotation is increased, typically to about 500 rpm. In this manner an essentially uniform film over the surface of the substrate is obtained. In a next step, the speed is increased to typically between 2000 and 5000 rpm to dry the film. Subsequent spin steps can include edge bead removal (EBR), during which the buildup at the outer edge of the wafer is removed, and back side removal (BSR). Appropriate spin speeds and solvents are employed for EBR and BSR. For example, isopropyl alcohol has been found effective for EBR, BSR, and clean up. As mentioned previously, the solvents in the coating solutions are compatible with typical coater materials.

Once the coating process as described above is completed, the coated substrate is heated to effect a bake and cure process. Any conventional apparatus known in the art can be employed for heating the coated wafer. Preferably, the apparatus for heating the wafer is an integral part of a spin coating apparatus used for coating the wafer, although a separate apparatus for curing coatings applied in accordance with embodiments of the present invention are also suitable. One commonly employed heating apparatus employs one or more "hot plates" to heat the wafer from below. The coated wafer is typically heated for up to about 120 sec at each of several hot plates at successively higher temperatures in a nitrogen/air atmosphere. Typically, the hot plates are at temperatures between about 70° C. and 350° C. One typical process employs a heating apparatus having three hot plates. First, the wafer is baked for 60 sec at 80° C. at the first hot plate to drive off the solvent in the coating solution. A second bake period of 60 sec at 150° C. on the second hot plate, is employed to provide planarization and begin cross-linking the copolymer. A third bake period of 60 sec at 250° C. on the third hot plate is used to continue cross-linking the copolymer.

A final cure cycle is preferably employed to complete the curing of the film. In a typical cure process, the baked wafer is cured for 0.5 hr at 400° C. in a nitrogen atmosphere, densifying the film. This final cure cycle can employ a conventional thermal curing apparatus, for example an oven chamber with a temperature range of about 300° C. to about 425° C. and preferably from about 375° C. to about 425° C. for about 0.5 to about 1 hour(hr). The cure is preferably performed in an environment that excludes oxygen and water.

The thickness of the resulting spin-on glass film ranges from about 1500 Å to 5500 Å. The film thickness is approximately proportional to the solid content of the coating solution and spin process parameters such as rotation speed.

The films produced by the standard process of this invention exhibit excellent planarization of typical semiconductor surfaces, demonstrating planarization of 93% or more on surfaces with characteristic feature spacing less than 0.5 $\mu$m. In addition, the films of the present invention exhibit excellent gap-filling capability, filling gaps or spaces between adjacent conductive paths of 0.05 $\mu$m or less. Typically the standard deviation of the thickness of the films produced is less that 2% of the film thickness.

Embodiments of the present invention exhibit excellent long term storage properties. Shelf life of nine months or greater at -15° C. is demonstrated for coating solutions of the present invention. The advantages of films of the present invention are further evidenced by the demonstration of thermal stability. Thermal stability of the films is indicated by the retention of Si—H bonds and absence of Si—OH bonds, as shown in the FTIR spectra of cured films subjected to temperatures between 400 and 550° C. in an inert atmosphere. Resistance to plasma oxidation is shown by the retention of Si—H bonds and absence of Si—OH absorption in the FTIR spectra of cured films treated with an oxygen plasma. Compatability with ordinary solvents is demonstrated in the spin coating process.

The following characteristics encompass non-limiting measurements that illustrate the properties of the poly (hydrido siloxane) copolymers, coating solutions, and thin films of the present invention.

1) Film Thickness (Å): Film thickness is measured using a calibrated Nanospec AFT-Y CTS-102 model 010-180 Film Thickness Measurement System available from Nanometrics, Co. An average of measurements at 5 locations on a wafer is reported as the film thickness for each sample.

2) Gap-fill Ability ($\mu$m): A patterned wafer with a cured, 0.4 $\mu$m layer of poly (hydrido siloxane) film formed thereon is cleaved to allow a cross-sectional view of the coated patterned wafer using a Scanning Electron Microscope (SEM), JOEL JSM-6000F model. Reported values represent gap sizes that are completely filled by the film without defects.

3) Molecular Weight ("MW"): Molecular weight calculated by retention time in gel permeation chromatography, relative to polystyrene standards using a Hewlett-Packard Series II 1090 Liquid Chromatograph. Weight average molecular weights are reported.

4) Chemical Structure: Chemical structure is analyzed by Fourier Transform Infrared Spectroscopy (FTIR) using a Nicolet Magna-IR model 550 spectrometer.

5) Water Absorption: The extent of moisture absorption is measured by Thermal Desorption Spectroscopy (TDS) using an MTM model WT-268 thermal desorption spectrometer.

6) Dielectric Constant: The dielectric constant of the cured film is measured using a Hewlett-Packard LCR meter model HP4275A.

7) Shelf Life: Shelf life is generally defined as the period in which the thickness of the film formed from a stored coating solution increases less than 5% over the thickness of an unstored solution.

EXAMPLES

Embodiments of the present invention will be further described and understood by reference to the following working examples thereof. These examples are provided to illustrate the present invention and do not provide limits or restrictions thereto.

A. Poly (hydrido siloxane) copolymer

Two synthetic procedures for hydridosilsesquioxane/ethoxyhydridosiloxane copolymer are included in the method of this invention. These routes are 1) high temperature synthesis, and 2) room temperature synthesis.

Example A1 describes the high temperature synthesis and Examples A2 and A3 describe the room temperature synthesis procedure. Example A4 describes the room temperature synthesis of hydridosilsesquioxane/ethoxyhydridosiloxane/silicon oxide terpolymer.

EXAMPLE A1

High Temperature Synthesis of HYDRIDOSILSESQUIOXANE/ETHOXYHYDRIDOSILOXANE COPOLYMER In a 5 L flask, 508.8 grams (g) (3.10 Mol) of triethoxysilane (HTEOS) and 508.8 g (8.77 Mol) of acetone were mixed by magnetic stirring and cooled to below 20° C. A mixture of 508.8 g (8.77 Mol) of acetone, 46.69 g (2.59 Mol $H_2O$, 0.0009 Mol $HNO_3$) of 0.02N nitric acid, and 37.03 g (2.06 Mol) of deionized water was added slowly through a dropping funnel to the mixture in the 5 L flask over a 45 minute period, maintaining the temperature below 20° C. The total weight of the solution was 1610 g. The solution was refluxed for 8 hours. A solution of hydridosilsesquioxane/ethoxyhydridosiloxane copolymer was obtained. The molecular weight of the copolymer in the copolymer solution was 20,000.

EXAMPLE A2

Room Temperature Synthesis of HYDRIDOSILSESQUIOXANE/ETHOXYHYDRIDOSILOXANE COPOLYMER To produce an approximately 300 g batch of copolymer, 44.46 g (0.272 Mol) of HTEOS, 4.05 g (0.225 Mol $H_2O$, 0.00008 Mol $HNO_3$) of 0.02N nitric acid, 7.65 g (0.425 Mol) of deionized water, and 239.7 g (2.724 Mol) of the solvent, ethyl acetate, were mixed in a plastic flask at room temperature (21° C.) and stirred for 69 hours. The product copolymer solution had a solid content of 5.03%. The molecular weight of the copolymer was 10,600.

EXAMPLE A3

Room Temperature Synthesis of HYDRIDOSILSESQUIOXANE/ETHOXYHYDRIDOSILOXANE COPOLYMER In a 500 ml flask, 16.0 g (0.0976 Mol) of HTEOS and 80.0 g (1.379 Mol) acetone were mixed. A mixture of 1.46 g (0.081 Mol $H_2O$, 0.00002 Mol $HNO_3$) of 0.02N nitric acid and 1.17 g (0.065 Mol) of deionized water was added to the mixture in the 500 ml flask. The total weight of the solution was 98.63 g. The solution was allowed to react at room temperature for 14 days. The copolymer concentration in the copolymer solution was 5.23% by weight.

EXAMPLE A4

Room Temperature Synthesis of HYDRIDOSILSESQUIOXANE/ETHOXYHYDRIDOSILOXANE/SILICON OXIDE TERPOLYMER In a 1 L flask, 41.0 g (0.250 Mol) of HTEOS, 20.8 g (0.100 Mol) of TEOS and 185.4 g (1.383 Mol) diethylene glycol dimethyl ether were mixed. A mixture of 2.875 g (0.1597 Mol $H_2O$, 0.0003 Mol $HNO_3$) of 0.1N nitric acid and 7.061 g (0.392 Mol) of deionized water was added to the mixture in the 1 L flask. The solution was allowed to react at room temperature for 24 hours. The molecular weight of the copolymer was 5000.

B. Coating Solutions

The process for producing coating solutions from the copolymer solutions of Examples A1–A4 includes a step to remove water and alcohol. Example B1 describes a process in which water and alcohol are removed by distillation. Example B2 describes a process in which water and alcohol are removed by rotary evaporation. In Example B3 the removal is by vacuum distillation.

EXAMPLE B1

Preparation of Coating Solution of HYDRIDOSILSESQUIOXANE/ETHOXYHYDRIDOSILOXANE COPOLYMER by Distillation A solvent mixture of 687 g (6.606 Mol) 2,2-dimethoxypropane (DMP) and 295 g (2.269 Mol) dibutylether (DBE) was prepared in a plastic container and added to the copolymer solution of Example A1, producing a total weight of 2592 g. The resulting solution was heated to between 48 and 52° C. for one hour. The solution was then heated to 80° C. to distill off 1770 g of volatile components. The final weight of the coating solution was 822 g. The copolymer content of the solution was 21.3%.

EXAMPLE B2

Preparation of Coating Solution of HYDRIDOSILSESQUIOXANE/ETHOXYHYDRIDOSILOXANE COPOLYMER by Rotary Evaporation In a first step, the 5% copolymer content copolymer solution of Example A2 was concentrated to 10% copolymer content by rotary evaporation of half the solvent volume at a temperature below 20° C. In a second step, the solution was diluted to 5% copolymer content by adding 148 g (1.682 Mol) of ethyl acetate. The combination of the first step followed by the second step was repeated twice until the final solution was 10% copolymer by weight and showed less than 1% ethanol by weight and less than 0.5% water by weight.

EXAMPLE B3

Preparation of Coating Solution of HYDRIDOSILSESQUIOXANE/ETHOXYHYDRIDOSILOXANE COPOLYMER by Vacuum Distillation The 5.23% copolymer content copolymer solution of Example A3 was concentrated to 25% copolymer content by vacuum distillation at a temperature below 20° C. In a dilution step, the solution was diluted to 12.5% copolymer content by adding 20.6 g (0.235 Mol) of ethyl acetate. In a distillation step, the solution was concentrated back to 25 weight % copolymer by vacuum distillation. The combination of the dilution step followed by the distillation step was repeated 3 times. 31.1 g (0.355 Mol) ethyl acetate was added to produce a coating solution of 10% copolymer content by weight. The molecular weight of the copolymer in the coating solution was 34,000.

EXAMPLE C1

Films formed from HYDRIDOSILSESQUIOXANE/ETHOXYHYDRIDOSILOXANE COPOLYMER coating solution A coating solution of Example B1 was applied to a six inch silicon wafer using a DaiNippon Screen Manufacturing spin coater model 80A with an integrated cure furnace. The spin cycle employed was in accordance with the following recipe in Table 1.

TABLE 1

| Spin Coating Process | | |
|---|---|---|
| Time (sec.) | Speed (rpm) | Step ID |
| 0.5 | 70 | Dispense SOG |
| 2.2 | 70 | SOG |
| 1.0 | 500 | |
| 20 | 3000 | Dry |

TABLE 1-continued

| Spin Coating Process | | |
|---|---|---|
| Time (sec.) | Speed (rpm) | Step ID |
| 2 | 1500 | |
| 4 | 1500 | Edge Bead Removal |
| 2 | 900 | |
| 4 | 900 | Back Side Removal |
| 6 | 3000 | |

After the spin cycles, the wafers were baked at 80° C., 150° C., and 250° C. for 60 seconds each and cured at 400° C. for 0.5 hr in a nitrogen atmosphere.

Properties of solutions of poly (hydrido siloxane) copolymer of Formula 1, coating solutions produced from copolymer solutions, and films produced from coating solutions of the present invention are illustrated below in Table 2.

TABLE 2

| | Properties | | |
|---|---|---|---|
| PROPERTY | Film from Example A1/B1 | Film from Example A2/B2 | Film from Example A3/B3 |
| Cured Film Thickness | 0.2–0.5 μm | 0.2–0.6 μm | 0.2–0.6 μ |
| Film Thickness Uniformity | >98% | >98% | >98% |
| Degree of Planarization at 0.5 μm | 93% | 93% | 93% |
| Gap Fill ability | <0.05 μm | <0.05 μm | <0.05 μm |
| Molecular Weight (copolymer solution) | 20,000 | 10,600 | 28,500 |
| Molecular Weight (coating solution) | 28,000 | 18,000 | 34,000 |
| Solid Content (wt %) | 21 | 9.0 | 9.5 |
| Shelf Life | >9 mos at −15° C. | 1 mo at −15° C. | 9 mos at −15° C. |
| SiOH/SiO IR intensity (cured film) | 0.00 | 0.00 | 0.00 |
| SiOH/SiO IR intensity (plasma exposed film) | 0.42 | 0.07 | 0.09 |
| Refractive index | 1.39 | 1.39 | 1.39 |

In view of the foregoing, it will be understood that embodiments of the present invention have been enabled that advantageously provide poly (hydrido siloxane) copolymers that are stable under storage for more than 9 mos at −15° C., that are resistant to degradation by oxygen plasma exposure, that are formulated with ordinary solvents, and that exhibit excellent planarization and gap filling ability. In addition, it will be realized that methods for making the aforementioned copolymers and method for making coating solutions of the copolymers have also been provided herein. It will be further realized that the use of aforementioned coating solutions to provide films on semiconductor substrates has been demonstrated.

We claim:

1. A solution for coating a semiconductor device comprising:

a poly (hydrido siloxane) copolymer having a general formula:

wherein R is a mixture of H and an alkyl group having between 1 and 4 carbon atoms; $a+b+c=1$; $0.5<a<0.99$; $0.01<b<0.5$; and $0<c<0.5$; and a solvent selected from the group consisting of dialkylketals, alkylacetates, dialkylacetals, ethers, dialkyl glycol ethers, ketones, and esters, or mixtures thereof, wherein said solution for coating a semiconductor has a water content of less than about 0.5% by weight and an alcohol content of less than about 1% by weight.

2. A solution for coating a semiconductor device comprising:

a poly (hydrido siloxane) copolymer having a general formula:

$$(HSiO_{1.5})_a(HSiO(OR))_b(SiO_2)_c,$$

wherein R is a mixture of H and an alkyl group having between 1 and 4 carbon atoms; a+b+c=1; 0.5<a<0.99; 0.01<b<0.5; and 0<c<0.5, and wherein the poly (hydrido siloxane) copolymer is produced by a process comprising:

charging a reaction vessel with at least one alkoxysilane and an aprotic solvent, wherein a first reaction mixture is provided;

adding an acid mixture to said first reaction mixture, wherein a second reaction mixture is provided; and polymerizing said second reaction mixture; and a 2,2-dialkoxypropane.

3. The solution for coating a semiconductor device of claim 2 wherein said 2,2-dialkoxypropane is selected from the group consisting of 2,2-dimethoxypropane, 2,2-diethoxypropane, and 2-ethoxy,2-propoxypropane.

4. The solution for coating a semiconductor device of claim 2 wherein said 2,2-dialkoxypropane is 2,2-dimethoxypropane.

5. The solution for coating a semiconductor device of claim 1 wherein said solvent is a 2,2-dialkoxypropane.

6. The solution for coating a semiconductor device of claim 1 wherein said solvent is selected from the group consisting of 2,2-dimethoxypropane, 2,2-diethoxypropane, and 2-ethoxy,2-propoxypropane.

7. The solution for coating a semiconductor device of claim 1 wherein said solvent is 2,2-dimethoxypropane.

8. The solution for coating a semiconductor device of claim 1 wherein the solution is stable for at least 9 months when stored at −15° C.

* * * * *